United States Patent
Häringer et al.

(10) Patent No.: US 6,954,093 B2
(45) Date of Patent: Oct. 11, 2005

(54) CLOCKING SCHEME AND CLOCK SYSTEM FOR A MONOLITHIC INTEGRATED CIRCUIT

(75) Inventors: Helmut Häringer, Winden (DE); Erik Schidlack, Freiburg (DE)

(73) Assignee: Micronas GmbH, Freiburg (DE)

(*) Notice: Subject to any disclaimer, the term of this patent is extended or adjusted under 35 U.S.C. 154(b) by 0 days.

(21) Appl. No.: 10/401,105

(22) Filed: Mar. 27, 2003

(65) Prior Publication Data

US 2004/0189366 A1 Sep. 30, 2004

(51) Int. Cl.[7] ............................................ H03L 7/06
(52) U.S. Cl. ........................................ 327/158; 327/161
(58) Field of Search ................................ 327/141, 158, 327/161–163, 269, 270

(56) References Cited

U.S. PATENT DOCUMENTS

| | | | |
|---|---|---|---|
| 4,618,788 A | 10/1986 | Backes et al. | 327/277 |
| 5,764,083 A * | 6/1998 | Nguyen et al. | 326/93 |
| 5,929,683 A | 7/1999 | Menkhoff | 327/292 |
| 6,188,262 B1 * | 2/2001 | Sutherland | 327/295 |

FOREIGN PATENT DOCUMENTS

| | | |
|---|---|---|
| EP | 0 274 606 | 11/1987 |
| WO | WO 02/01233 | 1/2002 |

* cited by examiner

Primary Examiner—Kenneth B. Wells
(74) Attorney, Agent, or Firm—O'Shea, Getz & Kosakowski, P.C

(57) ABSTRACT

Clocking scheme to clock a monolithic integrated circuit, having a basic clock rate (c0) generated by a clock source which is coupled to N intermediate clocks (c1 through cN) which are delayed relative to each other, wherein the individual delays (t) are distributed within a period T of the basic lock rate. Each of the N intermediate clocks (c1 through cN) supplies at least one of M data-processing blocks (D1 through DM). To effect a transfer of data between a transmitting data-processing block (D2) and a receiving data-processing block (D1), the delay of the intermediate clock assigned to the intermediate clock (c2) is greater than the delay of the intermediate clock (c1) assigned to the receiving data-processing block.

10 Claims, 3 Drawing Sheets

CLOCKING SCHEME AND CLOCK SYSTEM FOR A MONOLITHIC INTEGRATED CIRCUIT

BACKGROUND OF THE INVENTION

The invention relates to integrated circuits, and in particular to a clocking apparatus and method for a monolithic integrated circuit.

As the complexity, scope and signal processing speed of integrated circuits increase, their application increasingly entails the problem that the circuits also act as significant sources of electromagnetic interference. This problem involves not only the immediate environment or circuits not immediately adjacent, but also the actual circuit as an interference source affecting itself. This is especially true when analog stages are integrated into the system together with the purely digital signal-processing stages. These are often located in the input region in which analog signals must still be processed. Examples of analog stages include input amplifiers, analog-to-digital converters, or mixers. Interference is especially detrimental because the interference, or its harmonics, may enter the useful signal either directly or through its mixing products, as the signal amplitudes of the useful signal are still very small. Any superposition of additional interference signals may make itself evident immediately, thereby significantly disturbing the function of the overall circuit.

The main source of interference involves high current peaks that are directly coupled during synchronous signal processing to the system clock by which a great number of switching operations are triggered simultaneously. In circuits using complementary circuitry, such as CMOS, the gate capacities of the switching transistors are charged or discharged by the clock edges. Here the working edge of the system clock triggers all synchronous switching operations which are followed by a greater or lesser number of asynchronously occurring switching operations during this operating cycle. All switching operations must be completed before the new working edge of the system clock. Simultaneous with the charging and discharging of the gate capacitances, diffusion and line capacitances are also charged or discharged. All of the synchronously triggered charges and discharges are added to the internal and external clock lines and supply lines to form current peaks that generate electromagnetic and capacitive interference signals through the external supply lines as well as through the externally connected data lines.

The fundamental frequency of these interference signals is generally the clock frequency. Due to the great edge steepness of the current peaks, a corresponding number of strong harmonics are created as a result. In principle, the disadvantage of these simultaneously occurring switching operations may be avoided by using asynchronous sequential circuits. However, these add significantly more complexity to the development and layout of the circuit. In addition, few software tools exist that support an asynchronous design. Additional examples of known mechanisms for reducing internal and external interference include the following:

1. A favorable arrangement of the supply terminals which provide for simple external blocking by filtering such as capacitors or ferrite materials.

2. Internal blocking measures such as integrated blocking capacitors.

3. Internal and external shielding measures using grounding lines.

4. Automatically controlled output stages which prevent the rise and fall times of the switching edges from becoming too steep.

5. The lowest possible capacitive loads for charging and discharging.

6. Modulation of the clock frequency using a predetermined or random signal.

These measures are helpful in many cases, especially in relation to noncritical circuits. Their effectiveness is insufficient, however, for especially critical circuits.

Therefore, there is a need to reduce the effect of internal and external interference even in relatively complex monolithic integrated circuits.

SUMMARY OF THE INVENTION

The invention achieves this purpose by employing synchronous circuitry but not permitting the switching operations to occur simultaneously.

The clocking scheme starts here with a basic clock rate generated by a clock source, which clock rate is coupled by intermediate clocks delayed relative to each other by N, the individual delays being distributed within a period T of the basic clock rate. Each of the N intermediate clocks supplies at least one of M data-processing blocks of the monolithic integrated circuit. To ensure that the data transfer between a transmitting and receiving data-processing block is secure despite the clock shift, while also not necessitating any matching circuits, the relative clock delay must be larger for the transmitting data-processing block than the relative clock delay for the receiving data-processing block.

The N-delayed intermediate clocks from the basic clock rate are generated by a delay device using a delay network, at the taps of which the intermediate clocks may be picked up. Each of these intermediate clocks supplies at least one data-processing block within the monolithic integrated circuit. The transfer of data between individual data-processing blocks proceeds in such a way that the intermediate clock of the data block has a relatively longer delay than the intermediate clock of the receiving data block.

Advantageously, the critical steep current peaks become significantly smaller, and the number of current peaks within clock period T is increased. The lower height of the current peaks reduces the direct interference effect, and its denser distribution simplifies blocking measures since the interference spectrum is shifted toward higher frequencies.

It is expedient to have the maxima of the current peaks coupled to the intermediate clocks distributed as uniformly as possible, both in terms of their height as well as their time interval. The uniform height of the current peaks may be provided through the mutual delimitation of the individual data-processing blocks in the circuit layout. To this end, each data-processing block should have approximately the same number of synchronously controlled circuit elements during normal operation, although consideration must also be given to their differing sizes. The share of asynchronous switching elements in each data-processing block is thus of less significance since the switching instants of these elements generally do not coincide with the clock-controlled switching instant, and thus contribute little to the clock-coupled current peak. When N intermediate clocks are generated, the amplitude of the current peaks is theoretically reduced by the factor N. However, the real peak value deviates somewhat from this value in practice since the functional delimitation of the data-processing blocks must conform to predetermined constraints, and because the number of synchronous switching functions may differ from clock to clock. If the maximum occurring current peak is two or three times the mean of the other current peaks, the elimination of interference is still significantly better when compared to simple basic clock rate control. This is because the resulting current peak, when compared to the old current peak, only has the value 2/N or 3/N. In general, N is greater than or equal to 8. For values higher than N, such outliers are still less effective, since the overall reduction of current peaks is also greater. In terms of blocking measures, the increased frequency remains just as effective as before, and the outlier has an effect only through its differential value from the mean of the other current peaks.

The equal time distribution of the current peaks is achieved through the uniformity of the individual delay stages in the delay network. Matching the total delay time to the period of the basic clock rate is performed by a regulating circuit. One example of a delay device regulated in this way is the authors' European Patent application EP 0117669. When N different intermediate clocks are present, the fundamental frequency of the resulting current peaks is higher than the frequency of the fundamental clock rate by a factor of N. As a result, the spectrum of the interfering signals is shifted relative to the useful signal to higher frequencies, thereby making the internal and external blocking measures more effective.

Finally, the clock distribution method may be combined with the modulation method mentioned in the introduction. The modulation signal is a predetermined signal with a low frequency relative to the basic clock rate, a random signal, or a pseudo-random signal, the period of which is greater than the period of the basic clock rate. By modulating the basic clock rate, or the delay times of the intermediate clocks, the spectrum of the interfering signals may in effect occupy the free frequency ranges between the intermediate clocks. While there is no lowering of the respective interfering peaks, the interfering signal occurs at changing frequencies, and thus contributes less to any triggering of, or signal coupling to, another switching circuit. Due to the fact that the intermediate clocks have the time interval T/N, the modulation signal must only cover this relatively small range through changes in frequency or phase.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
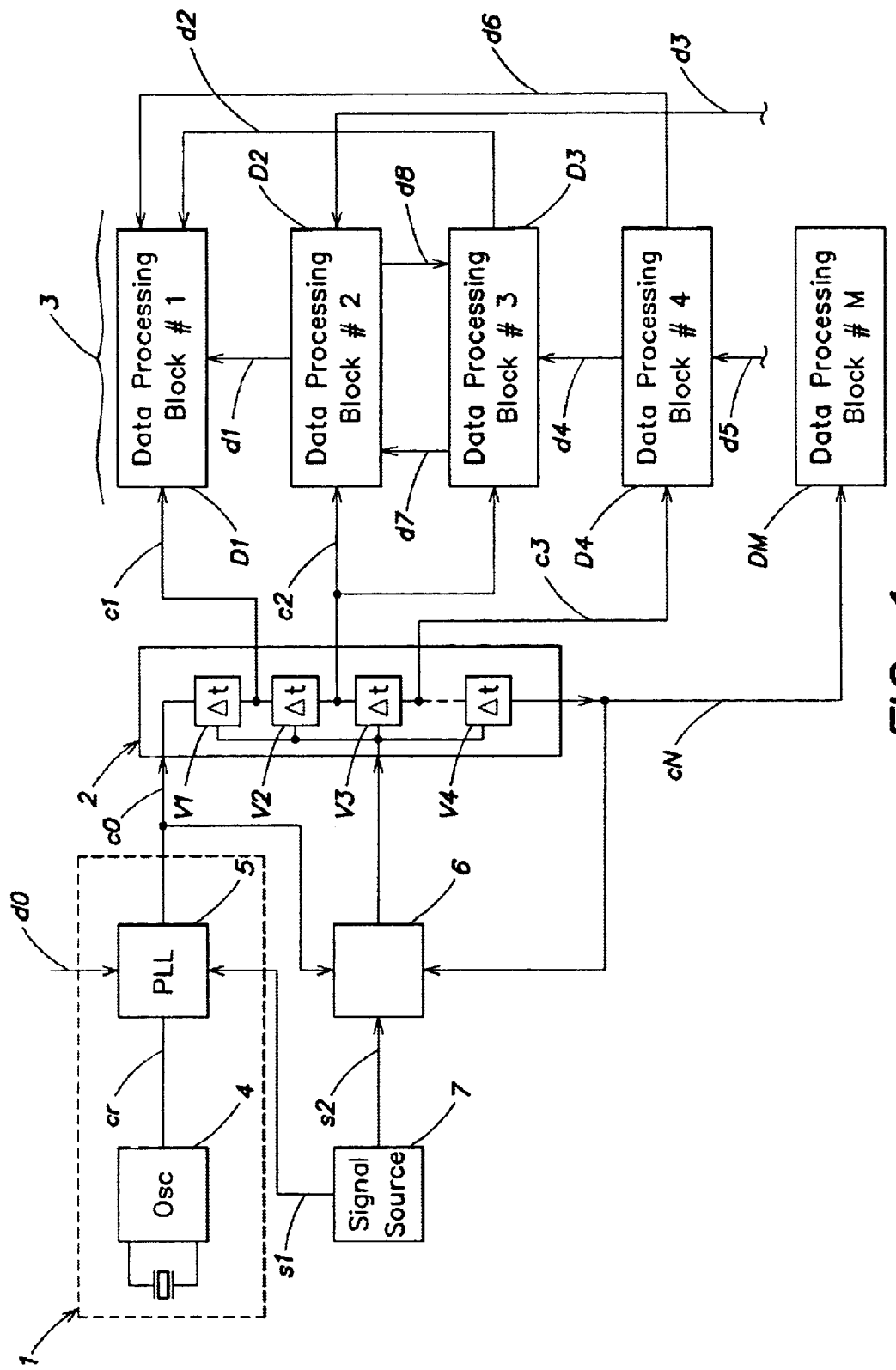
FIG. 1 is a schematic block diagram illustration of essential functional units of a clock system.

FIG. 1 is a block diagram illustration of an embodiment of a clock system according to the invention. A clock source 1 generates a basic clock rate c0 which is fed to a delay device 2. The delay device 2 contains a delay network of N delay stages V1–VN, from the taps of which N intermediate clocks c1–cN are picked up. Each of these N intermediate clocks supplies at least one of M data-processing blocks D1–DM which form the actual data processing device 3 of the monolithic integrated circuit. Due to the delay of the intermediate clocks relative to each other, any interchange of data is no longer possible among the data-processing blocks. First, it must be ensured that the transmitting data-processing block is already supplying stable data when data transfer is triggered at the receiving data-processing block by the active clock edge. The data processing operations to be performed by the transmitting data-processing block must have been completed before the data transfer is triggered in the receiving data-processing block; it is imperative that data processing has not just begun.

These two fundamental conditions for the reliable transfer of data have only been ensured if the relative delay for the receiving data-processing block is less than for the transmitting data-processing block, and internal data processing has been completed before the active clock edge of the receiving data-processing block. These conditions limit the processing time within the data-processing blocks, and as a result the full period T of the basic clock rate is no longer available for processing. However, given a sufficiently large number of intermediate clocks, the time loss may be kept to a minimum.

Examples of data buses between the individual data-processing blocks are shown in FIG. 1 under references d1, d2, d3, d4, and d5. The data bus d1 between the data-processing blocks D2 and D1 has only the smallest delay step T/N of delay device 2. The same is true for data bus d2 or d4 between data-processing blocks D3 and D1, or between the data processing blocks D4 and D3. Data bus d6 between the data-processing blocks D4 and D1 must take into account two delay steps T/N since these are controlled by intermediate clocks c3 or c1. The maximum allowable data processing time in the data-processing block D4 is thus restricted by two delay steps T/N relative to the full clock period T; at least in regard to the data transferred through the data bus d6, since this condition does not apply for the data on the data bus d4. The time restriction is even greater for the data bus d3 which supplies the data-processing block D2 with data from a data-processing block, not shown, for which the intermediate clock has an unknown delay which is, however, greater than for the intermediate clock c3.

To illustrate that one intermediate clock may supply more than two data-processing blocks, intermediate clock c2 is connected to both the data-processing blocks D2 and D3. A bidirectional data exchange is also possible between them through data buses d7 and d8, for which exchange, strictly speaking, the full period T of intermediate clock c2 is available.

Allocation of the individual circuit regions to the individual data-processing blocks D1 through DM must initially proceed according to functional aspects. According to the invention, however, the individual regions must be mutually delimited in such a way that the current peaks coupled to the respective working clock edges are as close as possible to the same height in the normal operating state. Since the analog and digital switching operations of monolithic integrated circuits may be very well simulated in computers, a balanced distribution can be found relatively quickly.

The example of a clock source 1 shown in FIG. 1 contains a quartz oscillator 4 which generates a reference clock cr for a phase-locked loop 5. The frequency of the basic clock rate c0 may be set within a wide range by the phase-locked loop 5 and by a supplied control command d0. The total delay time of the delay network is matched to the period T of the basic clock rate c0 via a control circuit 6. The identical delay stages V1 through VN thus subdivide the period T into N equal intervals T/N. Each delay stage thus delays the basic clock rate c0 by an additional time interval Δt=T/N. The result is N uniformly delayed intermediate clocks c1 through cN.

Finally, FIG. 1 also shows an optional signal source 7 which modulates the phase-locked loop 5 through its output signal s1, or at least modulates several delays in the delay device 3 through its output signal s2. As long as, for example, a triangular signal or saw-tooth signal having a lower fundamental, not a random signal, is employed as the modulation signal, the fundamental and harmonics may still be discerned in the resulting interference spectrum. It is also possible that not all data-processing blocks participate in the modulation, for example, in the case of data-processing blocks which have externally accessible data interfaces. Preferably, these data interfaces are also supplied with those intermediate clocks which have a small delay relative to the basic clock rate, or are even controlled directly by the basic clock rate. This depends on whether the clock for the specific data interface is also made accessible externally as the system clock.

Figure 2:
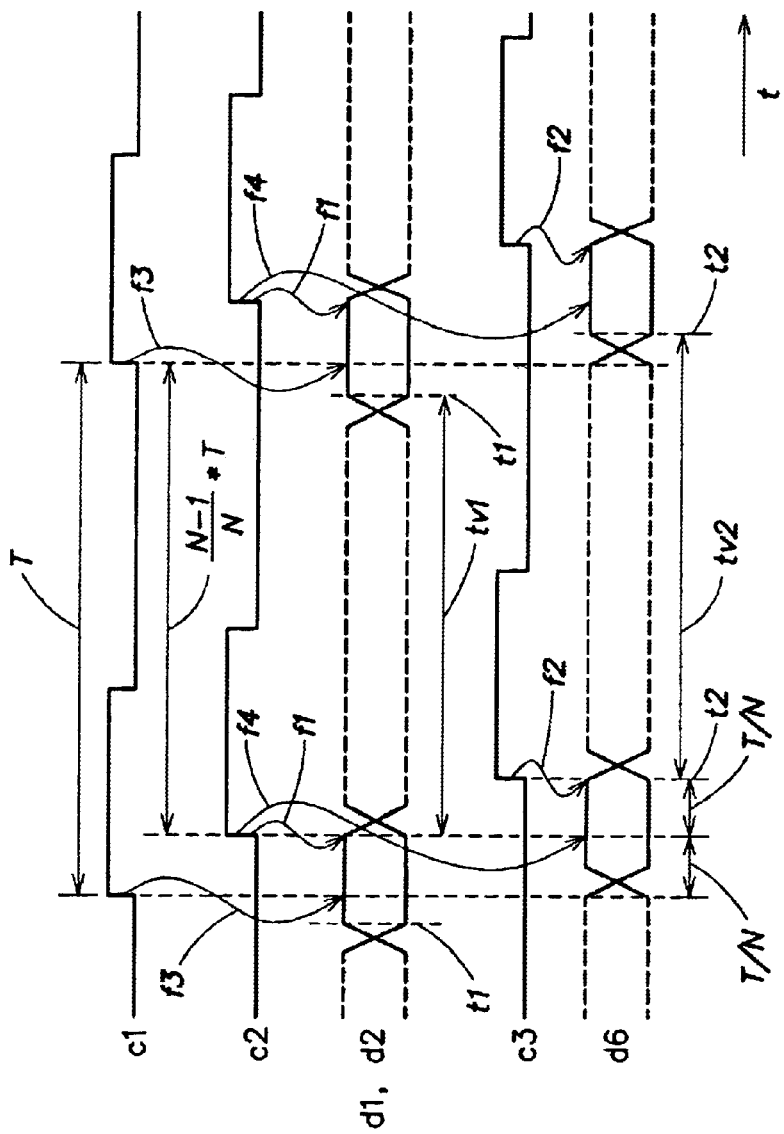
FIG. 2 is a schematic timing diagram of three intermediate clocks delayed relative to each other, and of the sequence of two associated data transfers.

FIG. 2 is a schematic timing diagram of three intermediate clocks c1, c2, and c3, and their associated data flows on data busses d1, d2, and d6. In regard to the intermediate clocks, which generally involve non-overlapping two-phase clocks, only one clock phase is shown, for the sake of simplification. The active clock edge is the leading edge, which may immediately effect a data exchange at the output of the respective data-processing block. This is indicated in the timing diagram by the curved arrows f1, f2. The fact that the data in this region are not yet stable is indicated by the broken lines in the data sequences of data-processing blocks d1, d2, d6. However, the unstable data states become stable in time before the data transfer—see times t1 and t2. During the data transfer effected by the positive clock edge, curved arrows f3, f4 show that the data transfer proceeds only in the stable data state. The data processing times tv1 and tv2 in FIG. 2 are relatively large and correspond to the maximum allowable processing time within the specific data-processing block. Generally, this limit is not exceeded since data processing is completed much earlier. For example, with intermediate-phase clocks, the stable output signal may usually be picked up whenever the active edge of the opposite-phase clock is present.

The timing diagram of FIG. 2 shows the period T of the basic clock rate c0 which also applies to all intermediate clocks c1 through cN. The time delay of the intermediate clocks relative to each other is the delay step T/N which subdivides period t into N equal delay steps T/N. As a result, the interval T(N−1)/N determined by the delay must not be exceeded in the specific data-processing block during signal processing—otherwise the data are no longer stable at the appropriate time. This limit T(N−1)/N is in fact further restricted by the set-up and hold times specified for a synchronous circuit layout.

Figure 3:
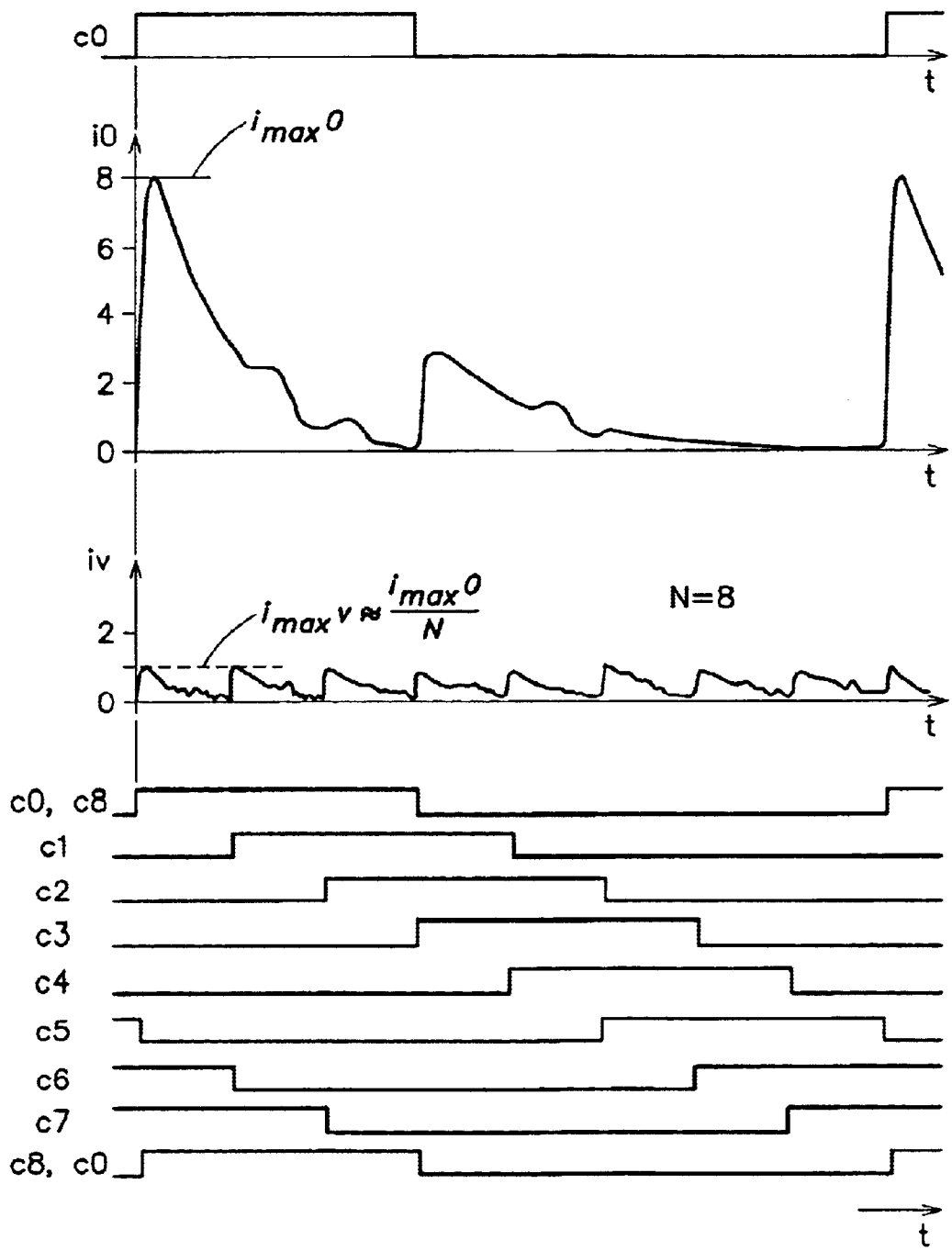
FIG. 3 is a schematic timing diagram of the improved current flow.

FIG. 3 is a schematic timing diagram showing the total current input i0 in connection with the basic clock rate c0, and the current input iv in connection with the various intermediate clocks c1 through c8. The current maximum $i_{max\ 0}$ of the total current i0 is reached when the active edge of the basic clock rate c0 appears. A secondary maximum is present on the trailing edge, or is triggered by an opposite-phase basic clock rate. If there is now a distribution, according to the invention, of the basic clock rate c0 into N=8 intermediate clocks c1 through c8, then the original total current i0 is broken up into a series of block currents. The combination of these block currents supplies the new total current iv which, however, has N=8 current peaks, as opposed to the one current peak, the maximum of these peaks $i_{max\ v}$ being, however, smaller by a factor of N=8. An additional advantage of the distribution, which is not obvious in FIG. 2, is the fact that the minimum currents are also distributed more uniformly. Due to the time-based staggering of signal processing within a clock period T, a more or less continuous plurality of switching operations takes place such that the current input almost never falls to the zero value, as is the case for synchronous processing by the basic clock rate c0. The difference between the minimum current input and current peaks at $i_{max\ v}$ is thus reduced, thereby also contributing to the elimination of interference signals.

Although the present invention has been shown and described with respect to several preferred embodiments thereof, various changes, omissions and additions to the form and detail thereof, may be made therein, without departing from the spirit and scope of the invention.

What is claimed is:

1. A method for generating a clock signal in a monolithic integrated circuit, said method comprising:

generating a basic clock signal;

processing said basic clock signal through a series of nominally equal delays to generate a plurality of intermediate clock signals which are delayed relative to each other, the individual delays being distributed within a period T of the basic clock rate, wherein the time period for each of said delays is time-modulated by a random signal (s2);

receiving at each of a plurality of data-processing blocks at least one of said plurality of intermediate clock signals, wherein said plurality of data-processing blocks includes a transmitting data-processing block (D2) and a receiving data-processing block (D1), and the delay of a second intermediate clock (c2) assigned to the transmitting data-processing block is greater than the delay of a first intermediate clock (c1) assigned to the receiving data-processing block.

2. The method of claim 1, wherein in said step of processing the delays of the plurality of intermediate clocks within the period T of the basic clock rate are distributed essentially uniformly.

3. The method of claim 2, wherein the plurality of data-processing blocks are mutually delimited such that the current peaks of the individual data-processing blocks, which current peaks are coupled to the clock edges of the intermediate clocks, are of essentially the same height, wherein the maximum ($i_{max\ v}$) of a given current peak coupled to the clock edge of the intermediate clock does not exceed the mean of the maxima of the current peaks coupled to the respective clock edges of the other intermediate clocks by a factor of 3.

4. A clock system for a monolithic integrated circuit, comprising:

a clock source that provides a clock signal of period T that is time-modulated by a pseudo-random signal to provide a basic clock signal the frequency and phase of which remain constant as averaged over time;

a delay device that receives said basic clock signal and delays said basic clock signal through a series of delay stages of equal duration, wherein said delay device includes a plurality of taps that each provide one of a plurality of intermediate clock signals each subjected to a different delay, and wherein the total delay provided by said series of delay stages is within the period T; and a plurality of data-processing blocks that each receive an associated one of said intermediate clock signals, wherein said plurality of data-processing blocks includes a transmitting data-processing block (D2) and a receiving data-processing block (D1), and the delay of a first intermediate clock signal coupled to the transmitting data-processing block is greater than the delay of a second intermediate clock coupled to said receiving data-processing block.

5. The clock system of claim 4, wherein said delay device comprises a plurality of series-connected delay stages, the total delay time of which comprises at least a period T of the basic clock rate, and at the taps of which the N intermediate clocks (c1 through cN) are picked up.

6. The clock system of claim 5, wherein the delays ($\Delta t$) of the delay stages (V1 through VN) are matched to the period T of the basic clock rate by a regulating circuit.

7. The clock system of claim 6, wherein the delays ($\Delta t$) of the delay stages (V1 through VN) are of equal length, a period T of the basic clock rate being subdivided into N equal delay steps T/N.

8. The clock system of claim 7, wherein for those data-processing blocks between which there is a transfer of data, the delay of the intermediate clock for the transmitting data-processing block (D2) is greater by at least the delay step T/N than for the receiving data-processing block (D1).

9. The clock system of claim 8, wherein the data processing device of the monolithic integrated circuit is subdivided among the data-processing blocks such that the resulting current peaks of the data-processing blocks contain no outliers exceeding the mean of the other current peaks by a factor of 3.

10. The clock system of claim 9, wherein at least a fraction of the delays ($\Delta t$) dependent on the delay stages is time-modulated by a random signal, the delays remaining constant as averaged over time.

* * * * *

UNITED STATES PATENT AND TRADEMARK OFFICE
CERTIFICATE OF CORRECTION

PATENT NO. : 6,954,093 B2
DATED : October 11, 2005
INVENTOR(S) : Häringer et al.

It is certified that error appears in the above-identified patent and that said Letters Patent is hereby corrected as shown below:

<u>Title page,</u>
Item [57], ABSTRACT,
Line 5, delete "(t)" and insert -- (Δt) --.
Line 6, delete "lock" and insert -- "clock" --.

Signed and Sealed this

Twenty-ninth Day of November, 2005

JON W. DUDAS
*Director of the United States Patent and Trademark Office*